US010186417B2

(12) United States Patent
Okamoto et al.

(10) Patent No.: US 10,186,417 B2
(45) Date of Patent: Jan. 22, 2019

(54) COATING FILM REMOVING APPARATUS

(71) Applicant: Tokyo Electron Limited, Tokyo (JP)

(72) Inventors: Norihiko Okamoto, Koshi (JP); Makoto Yamasaki, Koshi (JP)

(73) Assignee: Tokyo electron Limited, Tokyo (JP)

( * ) Notice: Subject to any disclaimer, the term of this patent is extended or adjusted under 35 U.S.C. 154(b) by 451 days.

(21) Appl. No.: 14/551,290

(22) Filed: Nov. 24, 2014

(65) Prior Publication Data

US 2015/0176139 A1 Jun. 25, 2015

(30) Foreign Application Priority Data

Dec. 20, 2013 (JP) ................................. 2013-263233
Aug. 11, 2014 (JP) ................................. 2014-163434

(51) Int. Cl.
| | | |
|---|---|---|
| *C23F 4/00* | (2006.01) | |
| *H01L 21/00* | (2006.01) | |
| *H01L 21/67* | (2006.01) | |
| *H01L 21/68* | (2006.01) | |

(52) U.S. Cl.
CPC .......... *H01L 21/00* (2013.01); *H01L 21/6708* (2013.01); *H01L 21/67259* (2013.01); *H01L 21/681* (2013.01); *H01L 21/67* (2013.01)

(58) Field of Classification Search
USPC ............ 156/345.24, 345.25, 345.55, 345.15, 156/345.16, 345.51, 345.54
See application file for complete search history.

(56) References Cited

U.S. PATENT DOCUMENTS

| | | | | | |
|---|---|---|---|---|---|
| 5,028,955 | A | * | 7/1991 | Hayashida | .......... G03F 7/70725 355/53 |
| 5,176,783 | A | * | 1/1993 | Yoshikawa | .......... H01L 21/6708 156/345.15 |
| 5,244,527 | A | * | 9/1993 | Aoyagi | ................. B24B 37/013 156/345.16 |
| 6,827,814 | B2 | * | 12/2004 | Taniyama | .......... H01L 21/6708 134/113 |
| 7,935,217 | B2 | * | 5/2011 | Yashiki | ............... H01L 21/6708 134/113 |

(Continued)

FOREIGN PATENT DOCUMENTS

| | | |
|---|---|---|
| JP | 2003-100704 A | 4/2003 |
| JP | 2008-182016 A | 8/2008 |

OTHER PUBLICATIONS

Machine Generated English Translation of JP 2003-100704. Published Apr. 4, 2003.*

*Primary Examiner* — Sylvia MacArthur
(74) *Attorney, Agent, or Firm* — Posz Law Group, PLC

(57) ABSTRACT

A coating film removing apparatus includes: a substrate holding mechanism that holds a substrate; an end surface detection mechanism that detects an end surface of the substrate; an end portion removing mechanism that removes an end portion of the coating film applied on the substrate; and a moving mechanism that moves the substrate holding mechanism or the end portion removing mechanism, wherein the end portion removing mechanism removes the end portion of the coating film applied on the substrate while the moving mechanism is relatively moving the substrate holding mechanism and the end portion removing mechanism according to the end surface of the substrate detected by the end surface detection mechanism.

8 Claims, 9 Drawing Sheets

(56) References Cited

U.S. PATENT DOCUMENTS

2006/0102289 A1* 5/2006 Fukatsu ............ H01L 21/67051
  156/345.55
2009/0227047 A1* 9/2009 Yang ................. H01L 21/30604
  438/8
2015/0176139 A1* 6/2015 Okamoto ................. H01L 21/00
  156/345.17

* cited by examiner

COATING FILM REMOVING APPARATUS

CROSS REFERENCE TO RELATED APPLICATIONS

This application is based upon and claims the benefit of priority of the prior Japanese Patent Application No. 2013-263233, filed in Japan on Dec. 20, 2013, and the prior Japanese Patent Application No. 2014-163434, filed in Japan on Aug. 11, 2014, the entire contents of which are incorporated herein by reference.

BACKGROUND OF THE INVENTION

1. Field of the Invention

The present invention relates to a coating film removing apparatus for removing a coating film formed at an end portion of the coating film formed on a substrate.

2. Description of the Related Art

In recent years, for example, in a manufacturing process of a semiconductor device, a semiconductor wafer (hereinafter, referred to as a "wafer") is progressively increased in diameter. Further, in a specific step such as mounting, the wafer is required to be thinned. For example, a thin wafer with a large diameter is transferred or subjected to polishing processing as it is, the wafer may be warped or broken. Therefore, for example, to reinforce the wafer, a wafer is bonded to a wafer being a support substrate or a glass substrate.

The bonding of the wafer with the support substrate is performed by using, for example, a bonder and an adhesive intervening between the wafer and the support substrate. The bonder has, for example, a first holding member that holds the wafer, a second holding member that holds the support substrate, a heating mechanism that heats the adhesive arranged between the wafer and the support substrate, and a moving mechanism that moves at least the first holding member or the second holding member in the vertical direction. Further, in the bonder, the adhesive is supplied between the wafer and the support substrate and heated, and then the wafer and the support substrate are pressed to be bonded together (Japanese Patent Application Laid-open No. 2008-182016).

When the wafer and the support substrate are pressed to be bonded together using the apparatus described in Japanese Patent Application Laid-open No. 2008-182016, the adhesive protrudes from between the wafer and the support substrate. Accordingly, removal of the adhesive at a wafer end surface portion is required. As a method of removing the end surface portion of the coating film formed of a coating solution applied on the wafer such as the adhesive, there is a known technique of removing the coating film (processing film) at the wafer end surface portion by discharging a solvent (removing solution) to the wafer end surface portion while rotating the wafer after the application of the coating solution to the wafer (Japanese Patent Application Laid-open No. 2003-100704).

However, it has been difficult to perform fine processing by the technique described in the Japanese Patent Application Laid-open No. 2003-100704 due to the influence of the kind and the film thickness and so on of the coating solution to be applied on the wafer. Besides, there are disadvantages that the solvent discharged to the wafer end surface portion splashes back and adheres to a wafer central portion and that it takes time to perform processing because the coating solution is applied to the wafer and then the coating film at the wafer end surface portion is removed as it is without moving the wafer, namely, the application and the end surface removal of the coating solution are performed in the same apparatus.

SUMMARY OF THE INVENTION

The present invention is a coating film removing apparatus for removing an end portion of a coating film applied on a substrate, the apparatus including: a substrate holding mechanism that holds the substrate; an end surface detection mechanism that detects an end surface of the substrate; an end portion removing mechanism that removes an end portion of the coating film applied on the substrate; and a moving mechanism that moves the substrate holding mechanism or the end portion removing mechanism. Further, the end portion removing mechanism removes the end portion of the coating film applied on the substrate while the moving mechanism is relatively moving the substrate holding mechanism and the end portion removing mechanism according to the end surface of the substrate detected by the end surface detection mechanism.

According to the present invention, an end portion of a coating film applied on a substrate can be successfully removed.

DETAILED DESCRIPTION OF THE INVENTION

Figure 1:
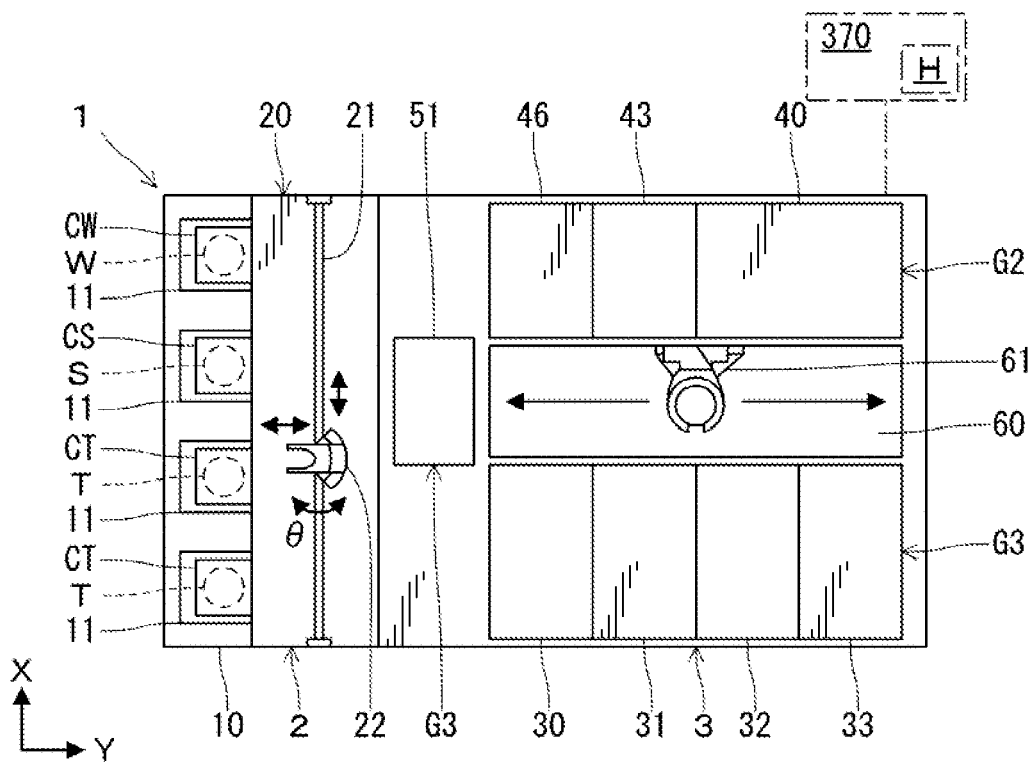
FIG. 1 is a plan view illustrating the outline of a configuration of a bonding system according to this embodiment.
Figure 2:
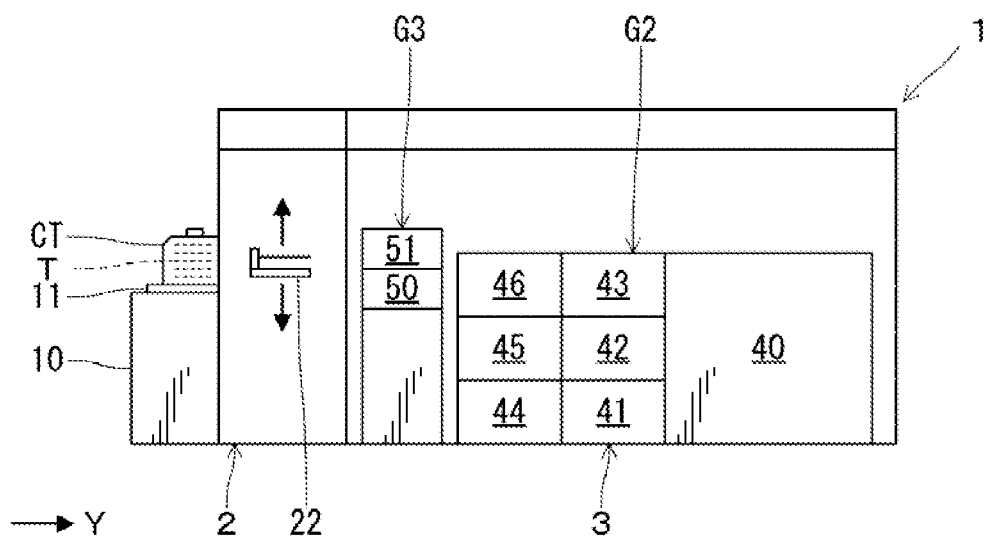
FIG. 2 is a side view illustrating the outline of an internal configuration of the bonding system according to this embodiment.

Hereinafter, embodiments of the present invention will be described. FIG. 1 is a plan view illustrating the outline of a bonding system 1 according to this embodiment. FIG. 2 is a side view illustrating the outline of an internal configuration of the bonding system 1.

Figure 3:
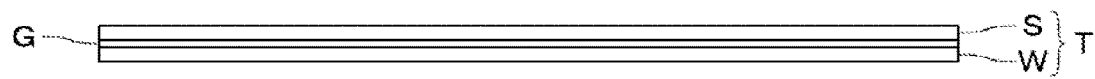
FIG. 3 is a side view of a wafer to be processed and a support wafer.

In the bonding system 1, a wafer W to be processed as a substrate to be processed and a support wafer S as a support substrate are bonded together via an adhesive G as illustrated in FIG. 3. In the bonding system 1, the wafer W to be processed and the support wafer S are bonded together to from a superposed wafer T as a superposed substrate. The wafer W to be processed is a wafer which will be a product, and has a bonded surface on which, for example, a plurality of electronic circuits have been formed and a non-bonded surface which will be subjected to polishing processing. The support wafer S is a wafer which has the same diameter as the diameter of the wafer W to be processed and supports the wafer W to be processed. Though a case where a wafer is used as the support substrate will be described in this embodiment, other substrates such as a glass substrate and the like may be used.

The bonding system 1 has a configuration in which a transfer-in/out station 2 to/from which cassettes CW, CS, CT capable of housing a plurality of wafers W to be processed, a plurality of support wafers S, and a plurality of superposed wafers T respectively are transferred-in/out from/to the outside, and a processing station 3 which includes various processing apparatuses each performing predetermined processing on the wafer W to be processed, the support wafer S, and the superposed wafer T, are integrally connected as illustrated in FIG. 1.

In the transfer-in/out station 2, a cassette mounting table 10 is provided. The cassette mounting table 10 is provided with a plurality, for example, four cassette mounting plates 11. The cassette mounting plates 11 are arranged side by side in one line in an X-direction (a top-down direction in FIG. 1). On the cassette mounting plates 11, the cassettes CW, CS, CT can be mounted when the cassettes CW, CS, CT are transferred-in/out from/to the outside of the bonding system 1. As described above, the transfer-in/out station 2 is configured to be able to hold the plurality of wafers W to be processed, the plurality of support wafers S, and the plurality of superposed wafers T. The number of the cassette mounting plates 11 is not limited to this embodiment but can be arbitrarily decided. Further, one of the cassettes may be used for collecting defective wafers. That is a cassette capable of isolating wafers in which defects have occurred in bonding the wafer W to be processed and the support wafer S because of various causes, from other normal superposed wafers T. In this embodiment, one cassette CT among the plurality of cassettes CT is used for collecting the defective wafers and the other cassettes CT are used for housing the normal superposed wafers T.

In the transfer-in/out station 2, a wafer transfer section 20 is provided adjacent to the cassette mounting table 10. In the wafer transfer section 20, a wafer transfer apparatus 22 movable on a transfer path 21 extending in the X-direction is provided. The wafer transfer apparatus 22 is movable also in the vertical direction and around the vertical axis (in a θ-direction) and thus can transfer the wafer W to be processed, the support wafer S, and the superposed wafer T between the cassettes CW, CS, CT on the cassette mounting plates 11 and later-described transition apparatuses 50, 51 in a third processing block G3 in the processing station 3.

In the processing station 3, a plurality of, for example, three processing blocks G1, G2, G3 each including various processing apparatuses are provided. The first processing block G1 is provided, for example, on the front side in the processing station 3 (on an X-direction negative direction side in FIG. 1), and the second processing block G2 is provided on the back side in the processing station 3 (on an X-direction positive direction side in FIG. 1). Further, the third processing block G3 is provided on the transfer-in/out station 2 side in the processing station 3 (on a Y-direction negative direction side in FIG. 1).

For example, in the first processing block G1, bonding apparatuses 30 to 33 each bonding the wafer W to be processed and the support wafer S together by pressing them via an adhesive G are arranged side by side in a Y-direction in this order from the transfer-in/out station 2 side.

For example, in the second processing block G2, as illustrated in FIG. 2, a coating apparatus 40 which applies the adhesive G to the wafer W to be processed, a coating film removing apparatus 41 which removes the applied adhesive G, heat processing apparatuses 42 to 43 each of which heats the wafer W to be processed coated with the adhesive G to a predetermined temperature, and similar heat processing apparatuses 44 to 46 are arranged side by side in this order in a direction toward the transfer-in/out station 2 (a Y-direction negative direction side in FIG. 2). The coating film removing apparatus 41 and the heat processing apparatuses 42 to 43 are provided at three tiers in this order from the bottom, and the heat processing apparatuses 44 to 46 are provided at three tiers in this order from the bottom. Note that the number of apparatuses and the arrangement in the vertical direction and the horizontal direction of the heat processing apparatuses 42 to 46 can be arbitrarily set.

For example, in the third processing block G3, the transition apparatuses 50, 51 for the wafer W to be processed, the support wafer S, and the superposed wafer T are provided at two tiers in this order from the bottom.

In a region surrounded by the first processing block G1 to the third processing block G3, a wafer transfer region 60 is formed as illustrated in FIG. 1. In the wafer transfer region 60, for example, a wafer transfer apparatus 61 is disposed. Note that the pressure inside the wafer transfer region 60 is the atmospheric pressure or higher so that transfer in a so-called atmospheric system of the wafer W to be processed, the support wafer S, and the superposed wafer T is performed in the wafer transfer region 60.

The wafer transfer apparatus 61 has a transfer arm movable, for example, in the vertical direction, the horizontal direction (the Y-direction, the X-direction) and around the vertical axis. The wafer transfer apparatus 61 can move in the wafer transfer region 60 to transfer the wafer W to be processed, the support wafer S, and the superposed wafer T to a predetermined apparatus in the first processing block G1, the second processing block G2, and the third processing block G3 therearound.

Figure 4:
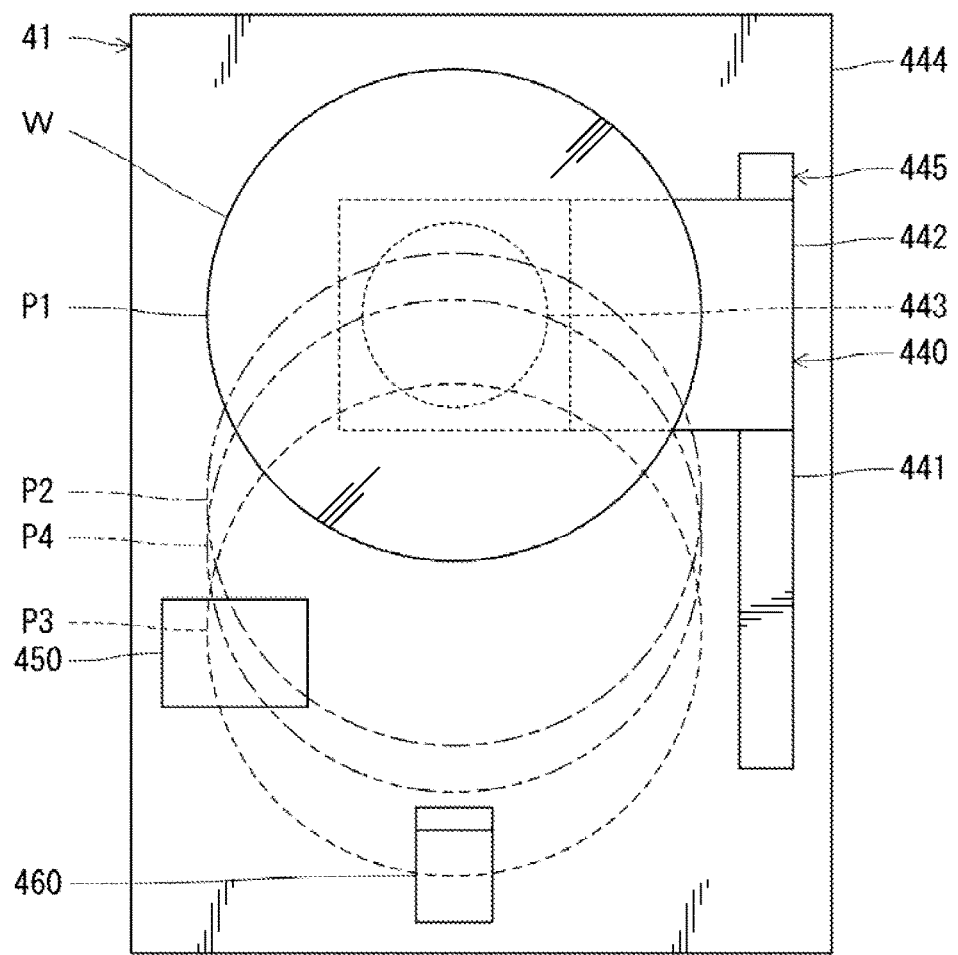
FIG. 4 is a top view illustrating the outline of a configuration of a coating film removing apparatus according to this embodiment.
Figure 5:
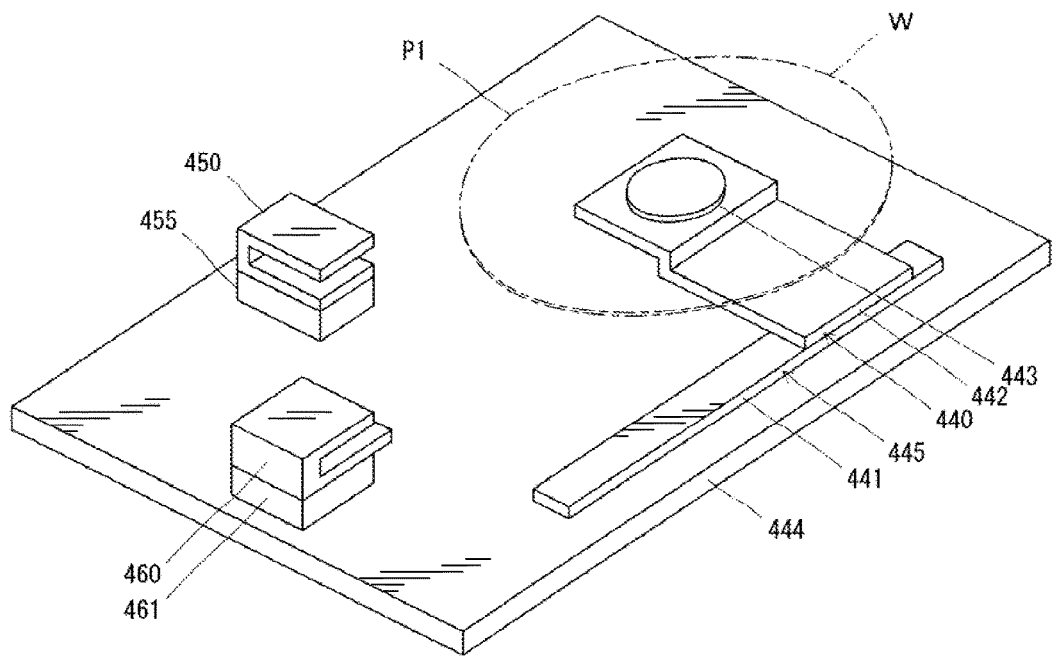
FIG. 5 is a perspective view illustrating the outline of a configuration of the coating film removing apparatus according to this embodiment.

Next, the configuration of the coating film removing apparatus 41 being an essential part of the present invention will be described. The coating film removing apparatus 41 has a substrate holding mechanism 440 that holds the wafer W to be processed as illustrated in FIG. 4 and FIG. 5. The substrate holding mechanism 440 has a rotation chuck 443 that holds and rotates the wafer W to be processed. The rotation chuck 443 has a horizontal upper surface, and the upper surface is provided with a suction port (not illustrated) that sucks, for example, the wafer W to be processed. By sucking through the suction port using a vacuum pump (not illustrated), the wafer W to be processed can be suction-held on the rotation chuck 443.

The rotation chuck 443 has, for example, a rotation mechanism (not illustrated) equipped with a motor or the like which can rotate the rotation chuck 443 at a predetermined speed.

The rotation chuck 443 is fixed to a chuck holding base 442. The chuck holding base 442 is movable by a moving mechanism 445 and capable of linearly moving on a guide rail 441 in the horizontal direction (X-direction). The guide rail 441 is fixed on a base plate 444. Note that for the movement in the horizontal direction (X-direction) of the rotation chuck 443, timing belt driving or ball screw driving may be used.

Figure 6:
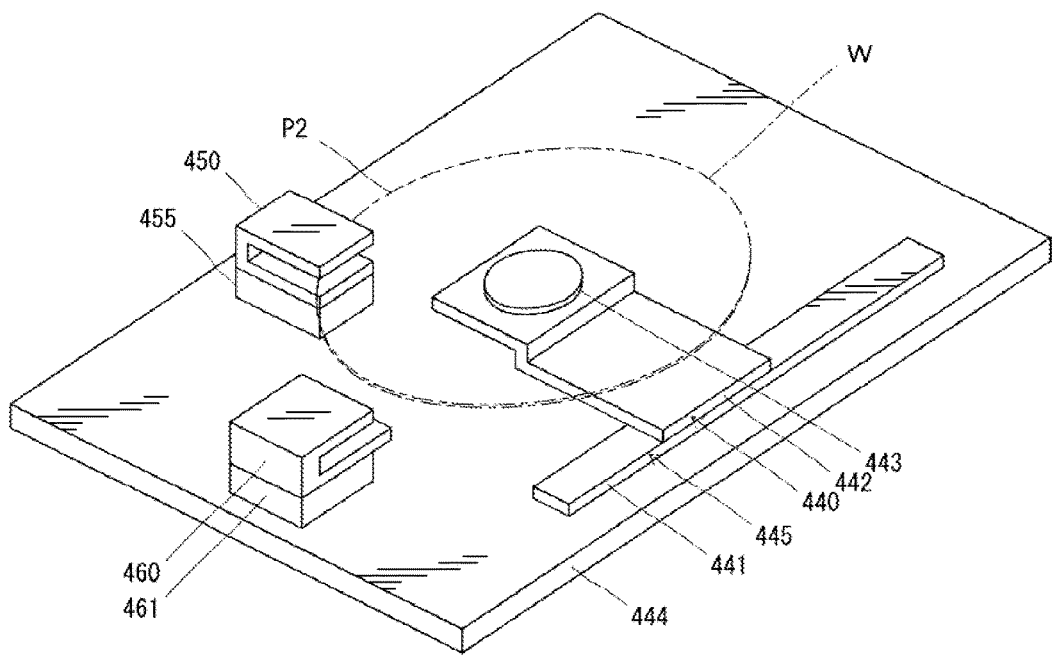
FIG. 6 is a perspective view illustrating the outline at the time of substrate end surface detection.

An end surface detection mechanism 450 for the wafer W to be processed will be described based on FIG. 6. On an X-axis positive direction side (this side in FIG. 6) of the rotation chuck 443, the end surface detection mechanism 450 for the wafer W to be processed is arranged. The end surface detection mechanism 450 for the wafer W to be processed is fixed on an end surface detection base 455. The end surface detection base 455 is fixed to the base plate 444.

Figure 7:
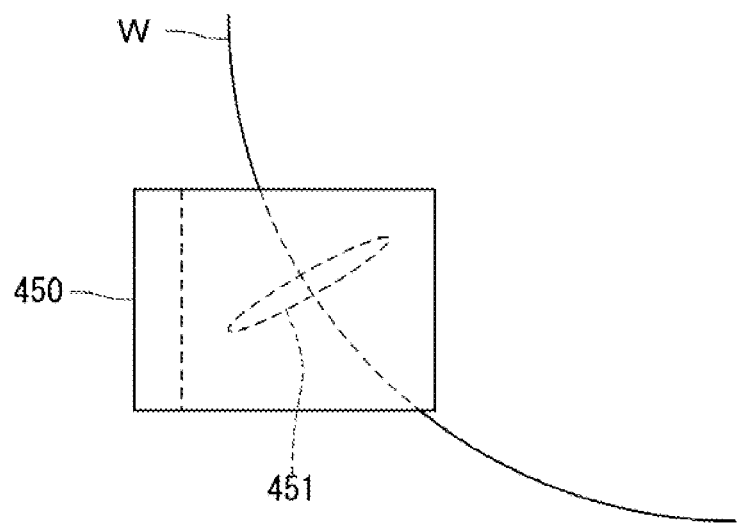
FIG. 7 is a top view illustrating the state at the time of the substrate end surface detection.
Figure 8:
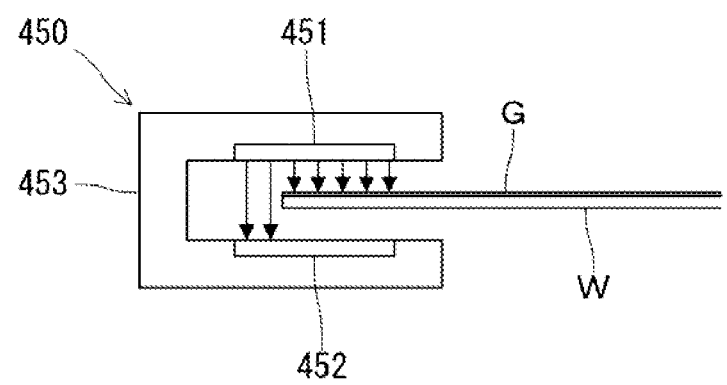
FIG. 8 is a side view illustrating the state at the time of the substrate end surface detection.

In the end surface detection mechanism 450 for the wafer W to be processed, a light emitting element 451 and a light receiving element 452, which are an image pickup device for detecting an end surface of the wafer W to be processed, are provided at a sensor fixing part 453 in a groove shape with one side surface open as illustrated in FIG. 7 and FIG. 8. Further, the light emitting element 451 and the light receiving element 452 are arranged to face each other in the groove of the sensor fixing part 453 such that when the end surface of the wafer W to be processed is located in the groove of the sensor fixing part 453, the light emitting element 451 is located above an end portion of a front surface of the wafer W to be processed and the light receiving element 452 is located below an end portion of a rear surface of the wafer W to be processed.

Light is radiated from the light emitting element 451 to an end surface portion of the wafer W to be processed and light not blocked by the end surface portion of the wafer W to be processed is received by the light receiving element 452, thereby making it possible to accurately detect an end surface position of the wafer W to be processed. With this configuration, the end surface detection mechanism 450 detects the position of the end surface portion of the wafer W to be processed at a rotation position of the wafer W to be processed along with the rotation of the wafer W to be processed in a state where the end surface of the wafer W to be processed is located in the groove of the sensor fixing part 453, and transmits information thereon to a control unit 370.

Figure 9:
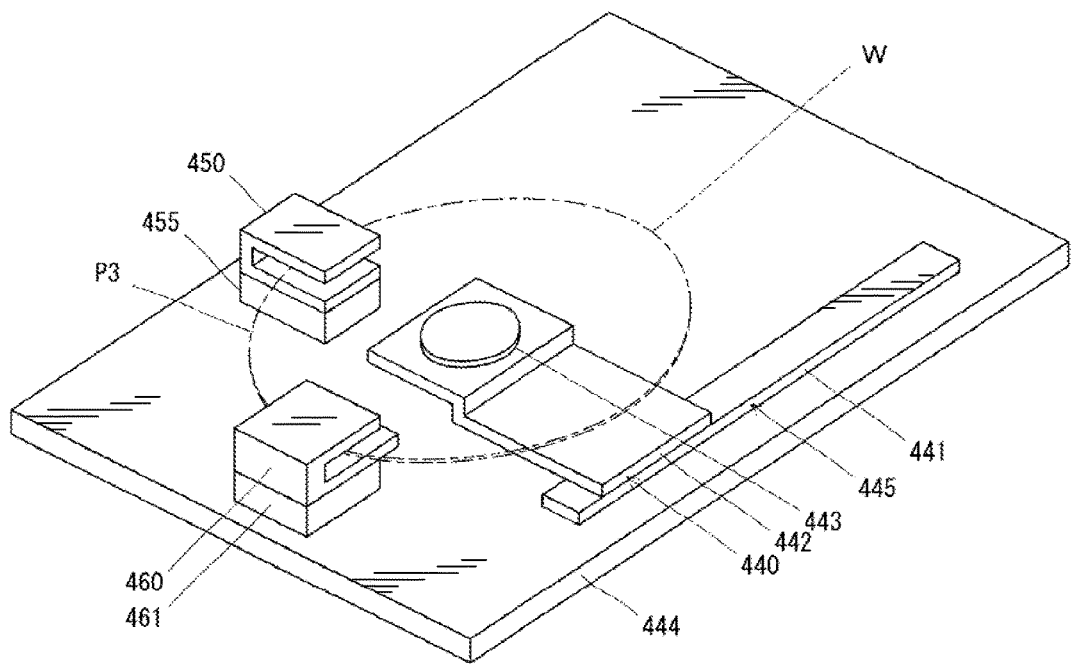
FIG. 9 is a perspective view illustrating the outline at the time of coating film end portion removal.

Next, an end portion removing mechanism 460 for the wafer W to be processed will be described based on FIG. 9. On an X-axis positive direction side (this side in FIG. 9) of the rotation chuck 443, the end portion removing mechanism 460 for the wafer W to be processed is arranged. The end portion removing mechanism 460 for the wafer W to be processed is fixed on an end portion removing base 461. Further, the end portion removing base 461 is fixed to the base plate 444. The end portion removing mechanism 460 for the wafer W to be processed is configured to be able to discharge a solvent for removing the coating film on the end portion of the wafer W to be processed and discharge an inert gas for drying the end portion of the wafer W to be processed from which the coating film has been removed.

Figure 10:
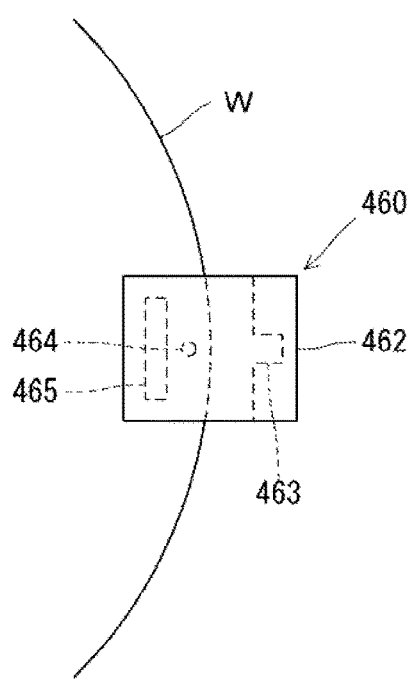
FIG. 10 is a top view illustrating the state at the time of the coating film end portion removal.
Figure 11:
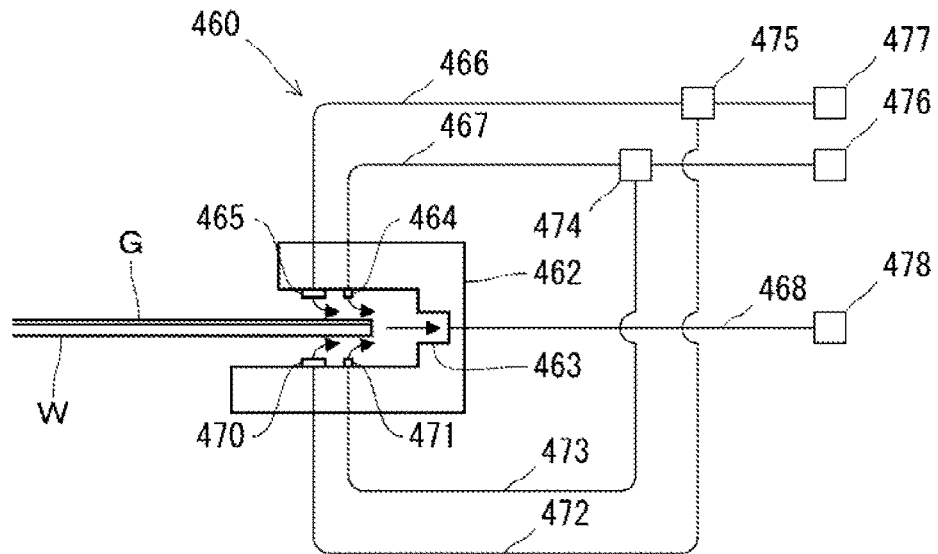
FIG. 11 is a side view illustrating the state at the time of the coating film end portion removal.

Details of the end portion removing mechanism 460 for the wafer W to be processed will be described based on FIG. 10 and FIG. 11. The end portion removing mechanism 460 for the wafer W to be processed has a main body in a shape of a groove with one side surface open, and an upper chemical solution discharge part 464 and a lower chemical solution discharge part 471 are arranged to face each other in the groove of the main body of the end portion removing mechanism 460 such that when the end surface of the wafer W to be processed is located in the groove of the main body of the end portion removing mechanism 460, the upper chemical solution discharge part 464 is located on the front surface side of the end portion of the wafer W to be processed and the lower chemical solution discharge part 471 is located on the rear surface side of the end portion of the wafer W to be processed. Besides, for drying the end portion of the wafer W to be processed, a first upper gas discharge part 465 and a first lower gas discharge part 470 are arranged to face each other in the groove of the main body of the end portion removing mechanism 460 as illustrated in FIG. 11. The first upper gas discharge part 465 and the first lower gas discharge part 470 are arranged to be located on the inner side, namely, on the side closer to the center of the wafer W to be processed, than are the above-described upper chemical solution discharge part 464 and lower chemical solution discharge part 471.

The upper chemical solution discharge part 464 and the lower chemical solution discharge part 471 discharge a solvent being a chemical toward the front surface and the rear surface of the wafer W to be processed, and thereby can dissolve the adhesive G at the end portion on the wafer W to be processed. Further, the first upper gas discharge part 465 and the first lower gas discharge part 470 discharge an insert gas being a gas toward the front surface and the rear surface of the end portion of the wafer W to be processed, and thereby can dry the solvent discharged on the wafer W to be processed.

The upper chemical solution discharge part 464 and the lower chemical solution discharge part 471 are connected respectively to an upper chemical solution pipe 467 and a lower chemical solution pipe 473 which are further connected to a chemical solution supply device 474 and a chemical solution supply source 476. Further, the first upper gas discharge part 465 and the first lower gas discharge part 470 are also connected respectively to a first upper gas pipe 466 and a first lower gas pipe 472 which are further connected to a first gas supply device 475 and a first gas supply source 477.

As illustrated in FIG. 11, discharge ports of the upper chemical solution discharge part 464 and the lower chemical solution discharge part 471 are each in a fine round nozzle shape such as, for example, a syringe needle and capable of discharging the solvent in a pinpoint manner on a peripheral edge portion of the wafer W to be processed. Besides, the discharge ports of the first upper gas discharge part 465 and the first lower gas discharge part 470 are each, for example, in a slit shape, and the gas discharged from them serves as a barrier that prevents the solvent discharged from the upper chemical solution discharge part 464 and the lower chemical solution discharge part 471 from scattering to the center side of the wafer W to be processed and takes a role to promote drying of the end portion of the wafer W to be processed.

At the time when the above-described solvent and gas are discharged, a first suction part 463 arranged on a back surface portion side in the main body of the back surface portion of the end portion removing mechanism 460 sucks the solvent and the gas and thereby can prevent them from scattering. Further, the first suction part 463 is connected to a first injector 478 via a first suction pipe 468, and a sucked waste solution is treated at a stage subsequent thereto.

In the above bonding system 1, the control unit 370 is provided as illustrated in FIG. 1. The control unit 370 is, for example, a computer and has a program storage part (not illustrated). In the program storage part, a program is stored which controls the processing on the wafer W to be processed, the support wafer S, and the superposed wafer T in the bonding system 1. Further, the program storage part also stores a program for controlling the operation of a driving system of the above-described various processing apparatuses and transfer apparatuses to realize the later-described bonding processing in the bonding system 1. Note that the programs may be the ones which are stored, for example, in a computer-readable storage medium H such as a computer-readable hard disk (HD), flexible disk (FD), compact disk (CD), magneto-optical disk (MO), or memory card, and installed from the storage medium H into the control unit 370.

Next, the bonding processing method for the wafer W to be processed and the support wafer S performed using the bonding system 1 configured as described above will be described.

First, a cassette CW housing a plurality of wafers W to be processed, a cassette CS housing a plurality of support wafers S, and an empty cassette CT are mounted on predetermined cassette mounting plates 11 in the transfer-in/out station 2. Then, a wafer W to be processed in the cassette CW is taken out by the wafer transfer apparatus 22 and transferred to the transition apparatus 50 in the third processing block G3 in the processing station 3.

Subsequently, the wafer W to be processed is transferred by the wafer transfer apparatus 61 to the coating apparatus 40.

In the coating apparatus 40, the adhesive G is supplied to the bonded surface of the wafer W to be processed while the wafer W to be processed is being rotated. The supplied adhesive G is diffused on the entire bonded surface of the wafer W to be processed by the centrifugal force, whereby the adhesive G is applied over the bonded surface of the wafer W to be processed.

The wafer W to be processed is then transferred by the wafer transfer apparatus 61 to the coating film removing apparatus 41. In the coating film removing apparatus 41, an end portion of the adhesive G applied to the bonded surface of the wafer W to be processed is removed. Note that details of an end portion removal process for the adhesive G performed in the coating film removing apparatus 41 will be described later.

The wafer W to be processed is then transferred by the wafer transfer apparatus 61 to the heat processing apparatus 42.

In the heat processing apparatus 42, the adhesive G on the wafer W to be processed is heated by performing heating, and the adhesive G is thereby hardened.

The wafer W to be processed subjected to the heat processing in the heat processing apparatus 42 is transferred by the wafer transfer apparatus 61 to the bonding apparatus 30.

During the time when the processing at the above-described steps are performed on the wafer W to be processed, the support wafer S is processed subsequent to the wafer W to be processed. The support wafer S is transferred by the wafer transfer apparatus 61 to the bonding apparatus 30. Note that the steps of transferring the support wafer S to the bonding apparatus 30 are the same as those in the above embodiment and therefore description thereof will be omitted.

In the bonding apparatus 30, the wafer W to be processed and the support wafer S are bonded together by the adhesive G.

Thereafter, a superposed wafer T made by bonding the wafer W to be processed and the support wafer S together is delivered from the bonding apparatus 30 to the wafer transfer apparatus 61.

The superposed wafer T is then transferred by the wafer transfer apparatus 61 to the heat processing apparatus 42. Then, in the heat processing apparatus 42, the superposed wafer T is temperature-regulated to a predetermined temperature, for example, room temperature (23° C.). Thereafter, the superposed wafer T is transferred by the transition apparatus 61 to the transition apparatus 51, and then transferred by the wafer transfer apparatus 22 in the transfer-in/out station 2 to the cassette CT on the predetermined cassette mounting plate 11. Thus, a series of bonding processing for the wafer W to be processed and the support wafer S ends.

Figure 17:
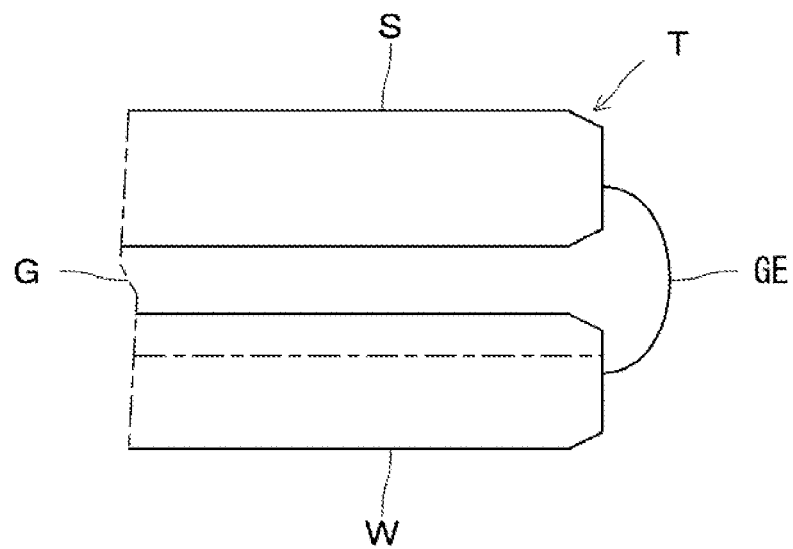
FIG. 17 is an explanatory view illustrating the appearance that an outside adhesive protrudes from an outside surface of a superposed wafer.

The wafer W to be processed is bonded to the support wafer S as has been described above. In this event, when the wafer W to be processed and the support wafer S are pressed while being heated in the bonding apparatus 30, the adhesive G protrudes from between the wafer W to be processed and the support wafer S as illustrated in FIG. 17. Thus, an outside adhesive GE protruding from the outside surface of the superposed wafer T is formed. Note that the adhesive G protruding from the outside surface of the superposed wafer T is given an individual name of the outside adhesive GE for convenience of explanation, but the adhesive G and the outside adhesive GE ae the same thing.

Here, after the bonding processing ends in the bonding system 1, the wafer W to be processed is thinned. At the time when the wafer W to be processed is thinned, if the outside adhesive GE is too large as compared to the position of the end portion (a one-dotted chain line in FIG. 17) of the wafer W to be processed after thinning, the outside adhesive GE adheres to the apparatus that thins the wafer W to be processed. This results in failure to appropriately thin the wafer W to be processed.

On the other hand, if the outside adhesive GE is too small as compared to the end portion of the wafer W to be processed after thinning, an outer peripheral portion of the wafer W to be processed may be damaged. In other words, the outer peripheral portion of the wafer W to be processed needs to be protected by the outside adhesive GE. Accordingly, the size of the outside adhesive GE protruding from the outside surface of the superposed wafer T in the above-described step is preferably a size with which the position of the lower end portion of the outside adhesive GE after the surface of the wafer W to be processed is removed coincides with the position of the end portion of the wafer W to be processed after thinning.

Hence, a removal width by which the adhesive G is removed in the step of removing the end portion of the coating film in the above-described coating film removing apparatus 41 is decided so that the position of the lower end portion of the outside adhesive GE after the surface of the wafer W to be processed is removed coincides with the position of the end portion of the wafer W to be processed after thinning. Here, if the adhesive G at the end surface portion of the wafer W to be processed is not removed according to the set removal width, the adhesive G will protrude from the outside of the superposed wafer T. However, in this embodiment, such a poor condition can be overcome by accurately performing end surface removal according to a designated removal width as described below.

Note that the width by which the adhesive G on the wafer W to be processed is removed, is decided by the control unit 370 based on at least the kind of the adhesive G, the target film thickness of the adhesive G to be applied on the wafer W to be processed, the heat processing temperature to heat the wafer W to be processed, or the pressure to press the wafer W to be processed and the support substrate.

The end portion removal process for the adhesive G performed in the coating film removing apparatus 41 will be described below using a flowchart in FIG. 13. The wafer W to be processed transferred into the coating film removing apparatus 41 is delivered onto the rotation chuck 443 and suction-held thereon (delivery position P1) as illustrated in FIG. 5 (Step S1 in FIG. 13).

First Embodiment

Next, an end surface detection process for the substrate will be described using FIG. 6 to FIG. 8. The rotation chuck 443 moves in the horizontal direction (X-positive direction) on the guide rail 441 to the position where the end surface portion of the wafer W to be processed is inserted into the end surface detection mechanism 450 in a U-shape while suction-holding the wafer W to be processed (Step S2 in FIG. 13). When the end surface portion of the wafer W to be processed is inserted into the end surface detection mechanism 450, the horizontal movement of the rotation chuck 443 is stopped (detection position P2).

Figure 13:
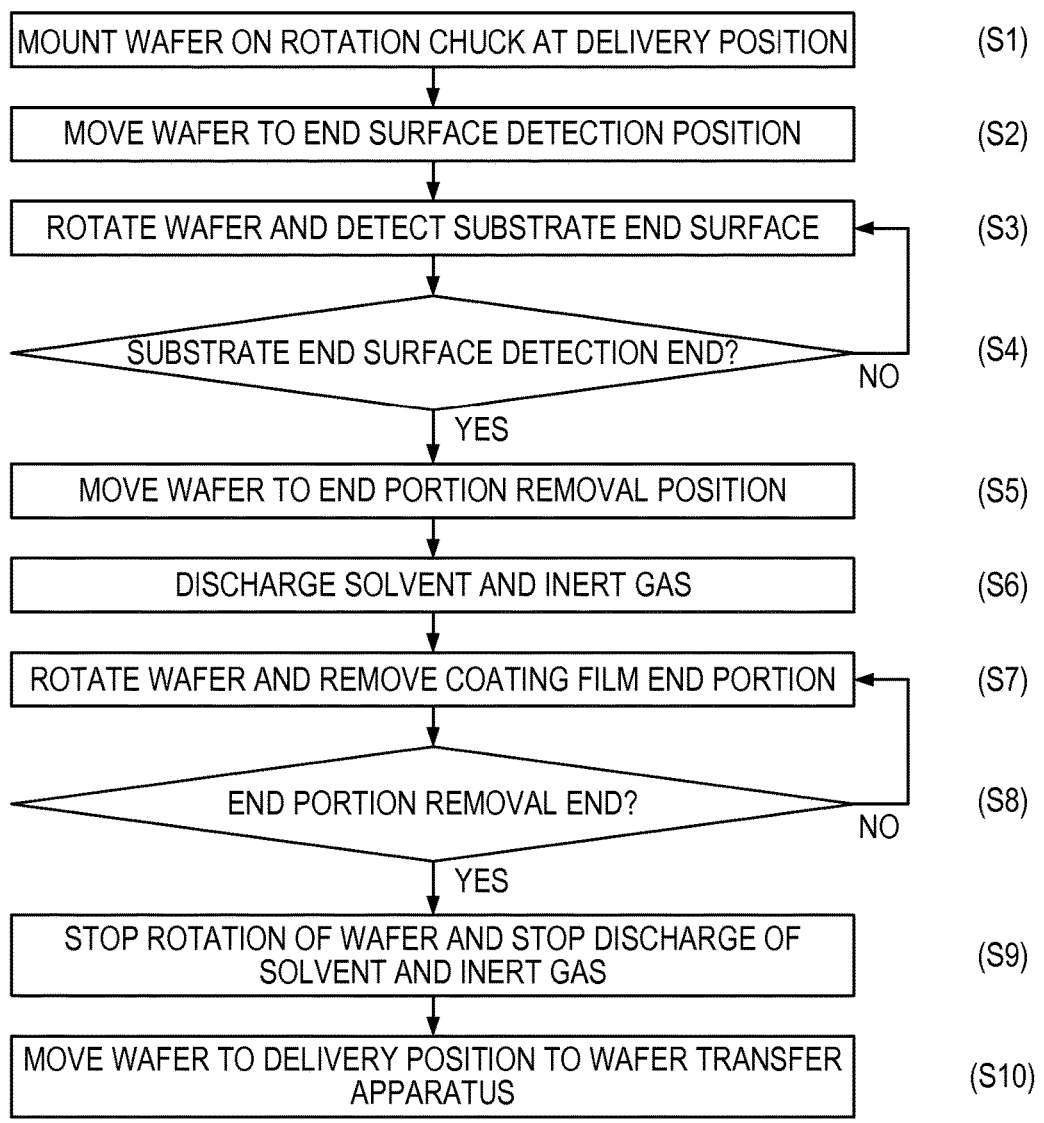
FIG. 13 is a flowchart illustrating a processing method of coating film end portion removal.

Thereafter, the light receiving element 452 receives light emitted from the light emitting element 451 to the end surface portion of the wafer W to be processed while the rotation chuck 443 is being rotated at a low speed, whereby the end surface position at each rotation position of the wafer W to be processed is detected and detected information is stored in the storage medium (Step S3 in FIG. 13). The rotation speed of the wafer W to be processed at this time is 3 to 10 rpm.

Here, the positional relationship between the rotation chuck 443 and the wafer W to be processed will be described. The wafer W to be processed transferred by the wafer transfer apparatus 61 onto the rotation chuck 443 is not always mounted on the rotation chuck 443 in a complete circle state where the center of the rotation chuck 443 is aligned with the center of the wafer W to be processed. Therefore, when the end portion removal is performed on the adhesive G applied on the wafer W to be processed without performing end surface detection on the wafer W to be processed that is mounted not in the complete circle state, the removal width of the adhesive G at the end surface position of the wafer W to be processed differs depending on the rotation position of the wafer W to be processed. For example, the end surface removal width at a position of 90 degrees from an end surface removal starting position of the wafer W to be processed is 5 mm, whereas the end surface removal width at a position of 180 degrees from the end surface removal starting position of the wafer W to be processed may be sometimes 3 mm. The end surface detection of the wafer W to be processed performed as in this embodiment makes it possible to accurately grasp the end surface position at each rotation position of the wafer W to be processed. Rotating the wafer W to be processed while appropriately moving the rotation chuck 443 in a positive direction or negative direction of the horizontal direction (X-direction) at the position of the end portion removing mechanism 460 based on the detected data makes it possible to uniform the end portion removal width of the adhesive G on the wafer W to be processed.

When the wafer W to be processed rotates one revolution or 360 degrees at the position (detection position P2) where it is inserted into the end surface detection mechanism 450, all end surface positions of the wafer W to be processed are detected, and their data is sent to the control unit 370 and stored. Thereafter, the rotation of the wafer W to be processed is stopped (Step S4 in FIG. 13).

Next, the end portion removal process will be described using FIG. 9 to FIG. 11. The rotation chuck 443 moves in the horizontal direction (X-positive direction) on the guide rail 441 to a position (waiting position P4) before a position where the end surface position of the wafer W to be processed is inserted into the end portion removing mechanism 460 in a groove shape with one side surface open and then temporarily stops the movement, and thereafter moves again in the horizontal direction (X-positive direction) on the guide rail 441 to a position (removal position) where the end surface position of the wafer W to be processed is inserted into the end portion removing mechanism 460 in the groove shape (Step S5 in FIG. 13). When the end portion of the wafer W to be processed is inserted into the end portion removing mechanism 460, the horizontal movement of the rotation chuck 443 is stopped (removal position P3). The insertion position of the wafer W to be processed at this time is decided by a desired removal width. Note that the wafer W to be processed may be directly moved from the detection position P2 to the removal position P3 without being temporarily stopped at the waiting position P4.

When the end portion of the wafer W to be processed is inserted into the end portion removing mechanism 460 in the groove shape, the upper chemical solution discharge part 464 and the lower chemical solution discharge part 471 discharge the solvent toward the front surface and the rear surface of the end portion of the wafer W to be processed. At the same time, the first upper gas discharge part 465 and the first lower gas discharge part 470 discharge the inert gas toward the front surface and the rear surface of the end portion of the wafer W to be processed. Furthermore, at the same time, an operation of sucking the solvent and inert gas discharged on the front surface and the rear surface of the wafer W to be processed is performed via the first suction part 463 (Step S6 in FIG. 13). Note that the solvent and the inert gas may be discharged after the wafer W to be processed is moved to the waiting position, and then the wafer W to be processed may be moved to the removal position. This provides an effect for preventing scattering of the solvent to the central portion of the wafer W to be processed.

The rotation of the wafer W to be processed is started while the first suction part 463 is sucking the discharged solvent and inert gas (Step S7 in FIG. 13). The rotation speed of the rotation chuck 443 at this time is, for example, 5 rpm. Dissolving the adhesive G with the solvent, drying the dissolved adhesive G and the solvent with the inert gas, and sucking the dissolved adhesive G, the solvent, and the inert gas by the first suction part 463, makes it possible to remove the adhesive G at the end portion of the wafer W to be processed by a fixed width without scattering the solvent and the adhesive G to the central portion of the wafer W to be processed (Step S7 in FIG. 13). These operations perform adhesive removal processing for the end portion of the wafer W to be processed in a processing time at a designated number of rotations (Step S8 in FIG. 13).

The upper chemical solution discharge part 464 and the lower chemical solution discharge part 471 are each in the fine round nozzle shape, and thus capable of discharging the solvent in a pinpoint manner at the end portion of the wafer W to be processed. This enables removal of the coating film of the adhesive G at the end portion of the wafer W to be processed in a minute width unit. Further, the insertion of the wafer W to be processed into the end portion removing mechanism 460 is performed by horizontal movement of the rotation chuck 443, and the horizontal movement can also be controlled in a minute unit by using motor driving.

How much the wafer W to be processed is inserted into the end portion removing mechanism 460 in the shape of a groove with one side surface open is decided by the value of the desired removal width. The desired removal width is larger, the insertion position of the wafer W to be processed into the end portion removing mechanism 460 is deeper. The removal width can be arbitrarily set and the insertion position can be automatically controlled depending on the end surface position of the wafer W to be processed obtained by the end surface detection mechanism 460, so that a fixed fine removal width can be obtained over the entire region of the end portion of the wafer W to be processed.

Further, the discharge port shapes of the first upper gas discharge part 465 and the first lower gas discharge part 470 are each, for example, in the slit shape and thereby can form airflow in the direction of the first suction part 463 in a manner to wrap around the solvent discharged from the upper chemical solution discharge part 464 and the lower chemical solution discharge part 471 in a wide range. Therefore, the discharged solvent never scatters to the central portion of the substrate but can be drained through the first suction part 463.

After the wafer W to be processed is rotated and the end portion removal processing is finished, the rotation of the wafer W to be processed is stopped. Thereafter, the discharge of the solvent and the inert gas is stopped, and the suction operation is also stopped (Step S9 in FIG. 13). Note that the rotation speed and the number of rotations of the wafer W to be processed can be arbitrarily set depending on the adhesive G and solvent in use. Further, the flow rates of the solvent and inert gas to be discharged can also be arbitrarily set depending on the kinds of the adhesive G and solvent and the thickness of the adhesive G.

Next, the rotation chuck 443 sucking the wafer W to be processed moves in the horizontal direction (X-negative direction) on the guide rail 441 and stops the movement after moved to the delivery position (delivery position P1) of the wafer W to be processed (Step S10 in FIG. 13), and the suction of the wafer W to be processed is released.

Figure 12:
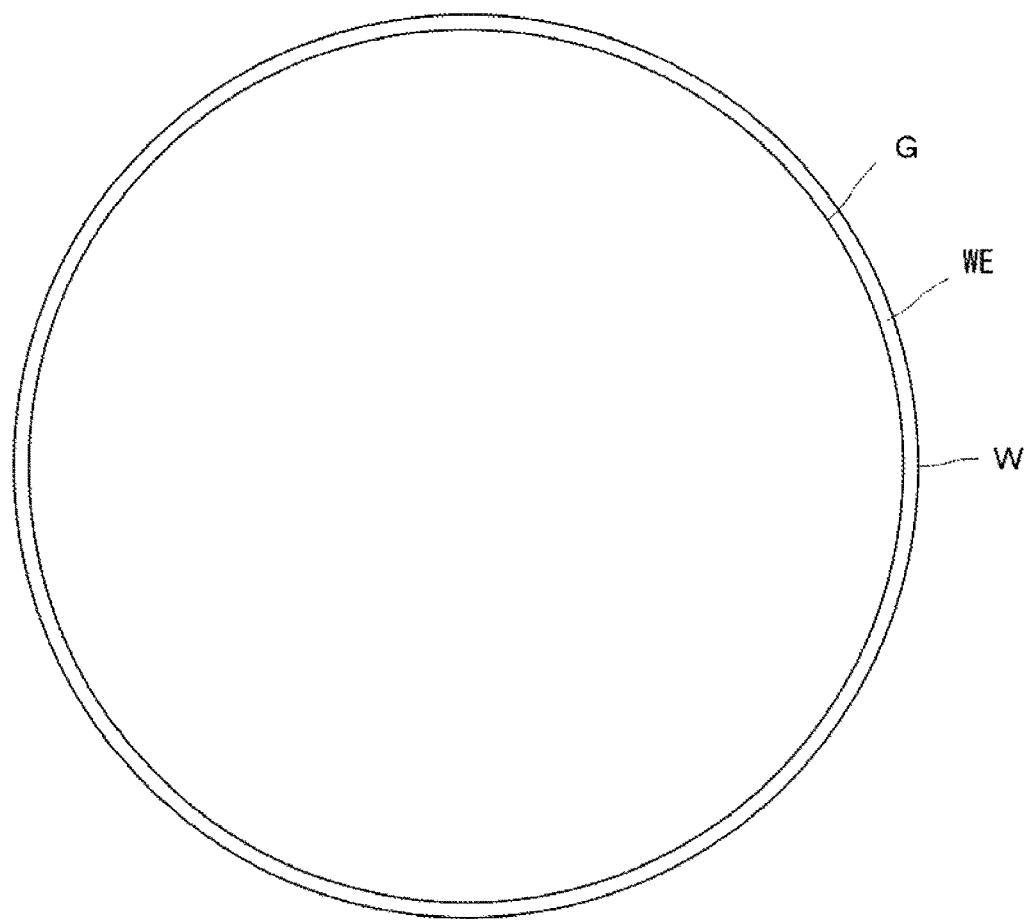
FIG. 12 is an explanatory view illustrating the appearance that an adhesive on an outer peripheral portion of the wafer to be processed has been removed.

According to the above embodiment, it is possible to rotate the wafer W to be processed in the end portion removing mechanism 460 in a complete circle state depending on the end surface position of the wafer W to be processed obtained by the end surface detection mechanism 450, and automatically control the insertion position of the wafer W to be processed to the end portion removing mechanism 460, so that the fixed fine removal width can be obtained over the entire region of the end portion of the wafer W to be processed as illustrated in FIG. 12. Further, sucking the discharged solvent and insert gas by the first suction part 463 can prevent the solvent and the inert gas from scattering to the front surface and the rear surface of the wafer W to be processed.

Second Embodiment

Figure 14:
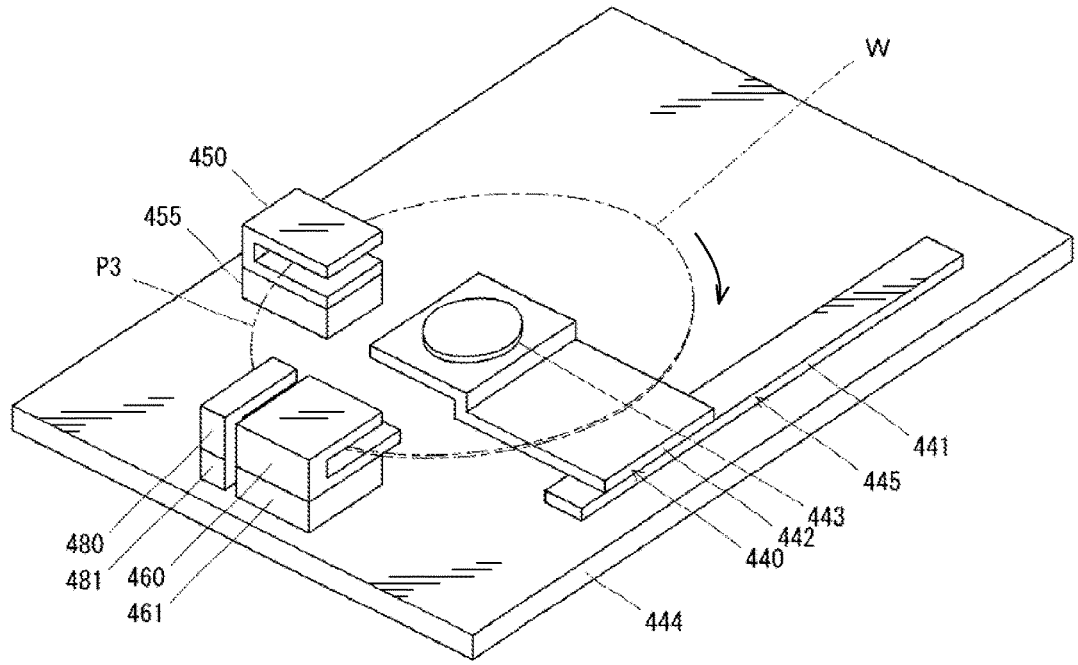
FIG. 14 is a perspective view illustrating the outline at the time of substrate end portion drying in another embodiment.

As illustrated in FIG. 14, an end portion drying mechanism 480 may be arranged on the downstream side in a substrate rotation direction of the end portion removing mechanism 460. The end portion drying mechanism 480 for the wafer W to be processed is fixed on an end portion drying base 481. Further, the end portion drying base 481 is fixed to the base plate 444. Further discharging the inert gas to the end portion from which the adhesive G has been removed by the end portion removing mechanism 460 enables additional drying of the end portion of the wafer W to be processed.

Figure 15:
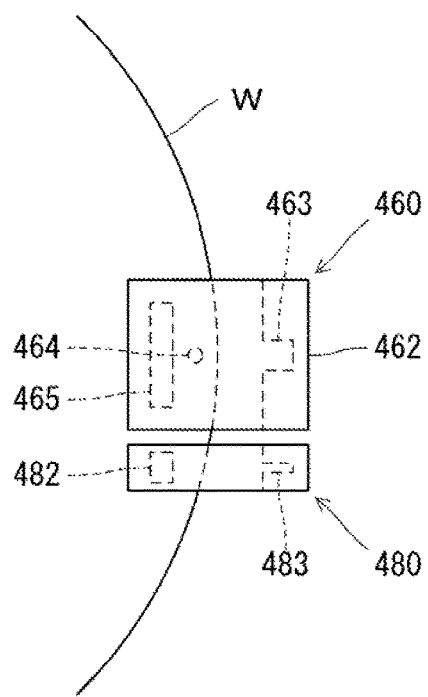
FIG. 15 is a top view illustrating the state at the time of the substrate end portion drying in another embodiment.
Figure 16:
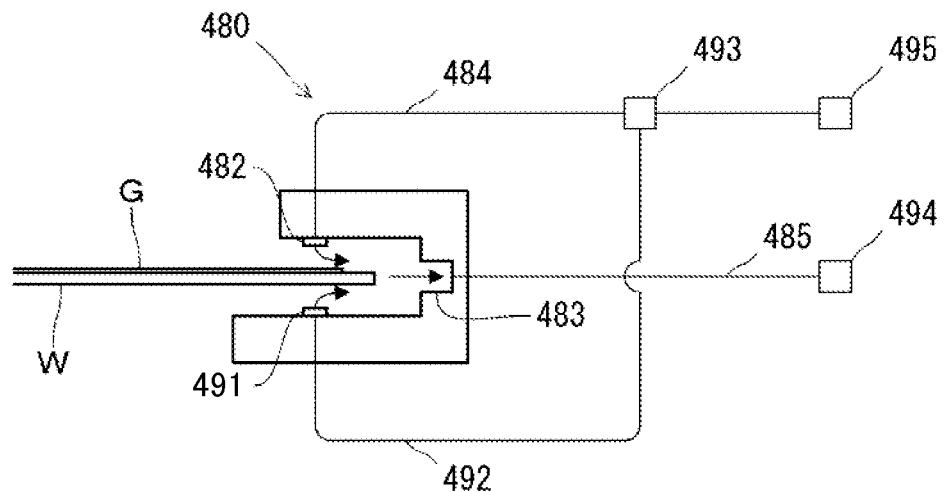
FIG. 16 is a side view illustrating the state at the time of the substrate end portion drying in another embodiment.

Details of the end portion drying mechanism 480 will be described based on FIG. 15 and FIG. 16. The end portion drying mechanism 480 has, similarly to the end portion removing mechanism 460, a main body in a shape of a groove with one side surface open, and a second upper gas discharge part 482 having a slit-shaped discharge port and a second lower gas discharge part 491 having a slit-shaped discharge port are arranged to face each other in the groove of the main body of the end portion drying mechanism 480 such that when the end surface of the wafer W to be processed is located in the groove of the main body of the end portion drying mechanism 480, the second upper gas discharge part 482 is located on the front surface side of the end portion of the wafer W to be processed and the second lower gas discharge part 491 is located on the rear surface side of the end portion of the wafer W to be processed.

The second upper gas discharge part 482 and the second lower gas discharge part 491 are respectively connected to a second upper gas pipe 484 and a second lower gas pipe 491 which are further connected to a second gas supply device 493 and a second gas supply source 495.

The inert gas is discharged from the second upper gas discharge part 482 and the second lower gas discharge part 491, and the inert gas is sucked by a second suction part 483 arranged on a back surface portion side in the main body of the end portion drying mechanism 480. The second suction part 483 is connected to a second injector 494 via a second suction pipe 485, and the sucked inert gas and solvent are treated at a stage subsequent thereto.

The second upper gas discharge part 482 and the second lower gas discharge port 491 of the end portion drying mechanism 480 perform an inert gas discharge operation at the same timing with the first upper gas discharge part 465 and the first lower gas discharge part 470 of the end portion removing mechanism 460. Besides, an inert gas sucking operation by the second suction part 483 is performed at the same timing with the inert gas sucking operation by the first suction part 463. Furthermore, an inert gas discharge stop operation by the second upper gas discharge part 482 and the second lower gas discharge part 491 of the end portion drying mechanism 480 and the sucking operation by the second suction part 483 may be stopped slightly behind the operations by the first upper gas discharge part 465, the first lower gas discharge part 470, and the first suction part 463. This is for stopping the operation of the gas at the point in time when the rotation position of the wafer W to be processed for which the operation by the end portion removing mechanism 460 is stopped is located at the end portion drying mechanism 480.

Further, the discharge port shapes of the second upper gas discharge part 482 and the second lower gas discharge port 491 are each, for example, in a slit shape and thereby can form airflow in the direction of the first suction part 463 in a manner to wrap around the end surface portion of the wafer W to be processed in a wide range. Therefore, it is possible to further proceed the drying of the end surface portion of the wafer W to be processed from which the adhesive G has been removed by the end portion removing mechanism 460.

According to the above embodiment, provision of the end portion drying mechanism 480 on the downstream side in the wafer rotation direction for the peripheral edge portion of the wafer W to be processed which has been subjected to the removal by the end portion removing mechanism 460 makes it possible to further proceed the drying of the peripheral edge portion of the wafer W to be processed.

Further, after the adhesive G is applied on the wafer W to be processed in the coating apparatus 40, the adhesive G on an outer peripheral portion WE of the wafer W to be processed is removed in the coating film removing apparatus 41. In this case, when the wafer W to be processed on which the adhesive G has been applied and the support substrate S on which the adhesive G is not applied are bonded together by pressing in the bonding apparatus 30, the outside adhesive GE protruding from between the wafer W to be processed and the support wafer S can be suppressed. This prevents the outside adhesive GE from adhering, for example, to the wafer transfer apparatus 61 and the processing apparatuses that perform the predetermined processing on the wafer W to be processed, the support wafer S, and the superposed wafer T. Accordingly, the wafer W to be processed and the support wafer S can be appropriately bonded together.

Further, the application of the adhesive G onto the wafer W to be processed is performed in the coating apparatus 40 and the end surface removal of the adhesive applied on the wafer W to be processed is performed in the coating film removing apparatus 41, thus requiring a short processing time in each of the apparatuses and also improving the throughput.

Further, linearly arranging the substrate position in the coating film removing apparatus 41 to P1 to P4 makes it possible to minimize the moving distance of the rotation chuck 443, resulting in a short moving time. Further, the arrangement of the end surface detection mechanism and the end portion removing mechanism 460 never interfere with the wafer W to be processed when it is delivered by the wafer transfer apparatus 61.

Though only the substrate holding mechanism 440 is moved by the moving mechanism 445 in the above embodiment, it is only necessary that the positions of the substrate holding mechanism 440 can be moved relative to the end surface detection mechanism 450 and the end portion removing mechanism 460, so that the substrate holding mechanism 440 may be fixed and the end surface detection mechanism 450 and the end portion removing mechanism 460 may be moved.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. The present invention is not limited to the embodiments but can take various aspects. The present invention is not limited to the case where the coating agent is the adhesive but also applicable to the case where the coating agent is a resist or other coating agents.

What is claimed is:

1. A coating film removing apparatus for removing an end portion of a coating film applied on a substrate, the apparatus comprising:
   a substrate holding mechanism that holds the substrate;
   an end surface detection mechanism that detects where a side end surface of the substrate exists;
   an end portion removing mechanism that removes a side end portion of the coating film applied on the substrate; and
   a moving mechanism that moves the substrate holding mechanism or the end portion removing mechanism,
   wherein the side end surface of the substrate is detected at a detection position, and the substrate is moved linearly by the moving mechanism from the detection position to a removal position,
   wherein the end surface detection mechanism detects, at the detection position, where the side end surface of the substrate exists at each rotation position of the substrate, prior to a removal by the end portion removing mechanism, and
   wherein the end portion removing mechanism removes the side end portion of the coating film applied on the substrate with a fixed removal width while the moving mechanism is relatively moving the substrate holding mechanism and the end portion removing mechanism based on where the side end surface of the substrate exists at each rotation position to maintain the fixed removal width while the substrate can rotate off-center, according to a result of a detection by the end surface detection mechanism.

2. The coating film removing apparatus according to claim 1,
   wherein the moving mechanism is configured to linearly move the substrate holding mechanism to:
   a delivery position where the substrate is delivered by the substrate holding mechanism,
   the detection position where the side end surface of the substrate is detected by the end surface detection mechanism, and
   the removal position where the end portion of the coating film is removed by the end portion removing mechanism.

3. The coating film removing apparatus according to claim 2, further comprising:
   an end portion drying mechanism that dries an end portion of the substrate and is arranged on a downstream side in a substrate rotation direction of the end portion removing mechanism.

4. The coating film removing apparatus according to claim 2,
   wherein the end portion removing mechanism comprises:
   a chemical solution discharge part that discharges a removing solution toward an upper surface and a lower surface of an end portion of the substrate;
   a gas discharge part that discharges a drying gas toward the upper surface and the lower surface of the end portion of the substrate;
   a suction part for sucking the discharged removing solution and drying gas,
   wherein the gas discharge part is arranged on a side closer to a substrate center than is the chemical solution discharge part.

5. The coating film removing apparatus according to claim 1, further comprising:
   an end portion drying mechanism that dries an end portion of the substrate and is arranged on a downstream side in a substrate rotation direction of the end portion removing mechanism.

6. The coating film removing apparatus according to claim 5,
   wherein the end portion drying mechanism comprises:

a gas discharge part that discharges a drying gas toward an upper surface and a lower surface of the end portion of the substrate; and a suction part for sucking the discharged drying gas, and wherein the gas discharge part is a slit-shaped discharge port.

7. The coating film removing apparatus according to claim 1, wherein the end portion removing mechanism comprises:

a chemical solution discharge part that discharges a removing solution toward an upper surface and a lower surface of an end portion of the substrate;

a gas discharge part that discharges a drying gas toward the upper surface and the lower surface of the end portion of the substrate;

a suction part for sucking the discharged removing solution and drying gas, wherein the gas discharge part is arranged on a side closer to a substrate center than is the chemical solution discharge part.

8. The coating film removing apparatus according to claim 7, wherein the gas discharge part has a slit-shaped discharge port.

* * * * *